United States Patent
Fowler

(10) Patent No.: US 6,864,709 B2
(45) Date of Patent: Mar. 8, 2005

(54) CROSS POINT SWITCH WITH SERIALIZER AND DESERIALIZER FUNCTIONS

(75) Inventor: Michael L. Fowler, Saco, ME (US)

(73) Assignee: Fairchild Semiconductor Corporation, South Portland, ME (US)

( * ) Notice: Subject to any disclaimer, the term of this patent is extended or adjusted under 35 U.S.C. 154(b) by 12 days.

(21) Appl. No.: 10/435,831

(22) Filed: May 12, 2003

(65) Prior Publication Data

US 2003/0210071 A1 Nov. 13, 2003

Related U.S. Application Data

(60) Provisional application No. 60/379,999, filed on May 13, 2002.

(51) Int. Cl.[7] .............................................. H03K 19/177
(52) U.S. Cl. ............................. 326/38; 326/39; 326/41
(58) Field of Search ...................................... 326/37–41

(56) References Cited

U.S. PATENT DOCUMENTS

| | | | |
|---|---|---|---|
| 5,424,589 A | * | 6/1995 | Dobbelaere et al. .......... 326/41 |
| 5,983,260 A | | 11/1999 | Hauser et al. |
| 6,531,887 B2 | | 3/2003 | Sun et al. |
| 6,545,504 B2 | | 4/2003 | Sun et al. |
| 6,573,749 B2 | | 6/2003 | New et al. |
| 6,577,161 B2 | | 6/2003 | Sun et al. |
| 6,587,890 B1 | | 7/2003 | Kult et al. |
| 2002/0009001 A1 | | 1/2002 | Theis et al. |
| 2002/0113619 A1 | * | 8/2002 | Wong .......................... 326/41 |
| 2002/0162033 A1 | | 10/2002 | Maxwell, Jr. et al. |

FOREIGN PATENT DOCUMENTS

WO  PCT US03/14847  8/2003

* cited by examiner

*Primary Examiner*—Anh Q. Tran
(74) *Attorney, Agent, or Firm*—Cesari and McKenna, LLP; Edwin H. Paul, Esq.

(57) ABSTRACT

A programmable switch of three or more ports, each port having data lines separate from lines sharing control and addressing. The programmable switch includes internal logic control and electronic modules that accept and deserialize the control and address signals. The logic control directs the data in signals to one or more of the output data lines. Since the data and control and addressing lines are separate, the control may act concurrently with the data to direct the data properly. The sending unit must synchronize such operations to ensure data coherency and proper timing. The data signal path from any input to any or all outputs is designed to have, typically, only a single logic gate or on transistor switch delay.

18 Claims, 5 Drawing Sheets

CROSS POINT SWITCH WITH SERIALIZER AND DESERIALIZER FUNCTIONS

CROSS-REFERENCE TO RELATED APPLICATIONS

The present application claims the benefit of U.S. Provisional Patent Application Ser. No. 60/379,999 entitled "CROSSPOINT SWITCH," which was filed on May 13, 2002, of common inventorship, ownership and which application is hereby incorporated herein by reference.

BACKGROUND OF THE INVENTION

1. Field of the Invention

The present invention is related to control of switches and more particularly to control of multi-port cross-point switches.

2. Background Information

Multi-port switches or cross-point switches are found in increasing numbers in the modern communication systems, including electrical and optical equipment found in telephony, data, audio, and video networks that are proliferating on the Internet and in the smaller networks found in buildings, laboratories, and offices.

The need for ever faster, more flexible, and adaptable and scalable switches is the norm in the evolving technology.

There are numerous patents relating to cross-point switches, one such being U.S. Pat. No. 5,983,260, to Hauser et al. that issued on Nov. 9, 1999, which patent is hereby incorporated herein by reference. This patent discloses a system level switch designed for cell processing, that is packets or formatted frames, and not to raw or generic data. The patent does not describe typical addressing and control schemes and therefore relies on the known organizations described below. This patent is typical of the patents in the field.

Known methods of control of cross-point switches fall generally into two categories. First, as shown in FIG. 1, is to multiplex data with the address and control of the switch. FIG. 2 shows the sharing of time between the control and addressing and the data. That is if, for example, there was a four port switch, each port would have a single line or set of lines that will carry address and control followed by data. In this system, the address and control are received and de-serialized and interpreted. The data is then switched to the designated output port and the data is sent along with control and address information. In such a system there must be a known protocol that allows the address and control to be distinguished from the data, and some means for determining when the data has ended. Such packetizing or formatting techniques or protocols are well known in the art, for example using Ethernet, TCP/IP, FTP, and many others known in the art.

One limitation of the above first type of control is the latency caused by the need to de-serialize the address and control information and then direct the data out through a deserializer/reserializer path. For example if the two channels are running at different clock rates, the data must be deserialized and then serialized at the different clock rate. Such operations include inherent delays called latency.

Other drawbacks of this form of switching include bottlenecks and/or storage requirements. For example, the packetized crosspoint switch has the limitation that the packet currently being sent must be processed and a decision must be made on whether the output port is available or not. In the case that the output port is not available, the packet cannot be sent and the complete path must await the opening of the output path, and the packet must be stored.

Another known switch control arrangement includes using one programming input path of a cross-point switch to program all the ports. This allows all the ports to be set up so that data will flow as directed. FIG. 3 represents this arrangement.

One limitation of this second type of control arrangement is the need for a separate connection from any of the many I/O boards that may wish to send or received data through the cross-point switch. These types of systems usually need a shared backplane bus where they can address and set-up the cross-point switch. This single programming input path also can become a bottleneck, limiting the speed at which the crosspoint switch can be programmed for one configuration and then reprogrammed later for a different configuration. In comparison, the first type of control is accomplished through the same input/output lines that transmit the data with no need for extra inputs.

There is a need to improve the switch setup and data throughput latencies.

SUMMARY OF THE INVENTION

In view of the foregoing background discussion, the present invention provides. a bidirectional interchange of control/address separately from the data for each port of a "crosspoint type switch." Herein after this separation of data from control and addressing for each port is referred to as "factored architecture." The separate data and control/addressing lines provide information interchange among all ports resulting in the following advantages:

Multiple data transfer requests can be evaluated, concurrently, to seek the request that corresponds to an open output port.

No bandwidth on the data lines is used for control/address, since these lines are separate.

Zero setup latency since data transfer requests can be evaluated concurrently with data from a previous request being transferred.

That is while data is being transferred the set up information for a subsequent transfer can be sent and be waiting so that when the previous data transfer is complete the new set up can be immediately accomplished.

Data transmission latency can be minimized since no control and address information, relevant to the switching, is processed in the switch. Therefore the data can be simply directed to the output port or ports and passed through with no deserializing or latching—with no processing delay. When high speed clocks, in a preferred embodiment clock speeds greater than two megaHertz, a latch may be used between the data in and data out lines. However, even in such instances the delay needed will be for only a few clock cycles, usually ten to twenty.

In a preferred embodiment, a global clock may be implemented to reduce transmission delays even further—to less than a few bit times. The only accommodation required with such an architecture with global clocking is to allow for phase delays between the transmitting clock at a serializer and the receiving clock at a deserializer at the physical systems sending and receiving data via a crosspoint switch. Clock boundaries would not be crossed. In such a preferred embodiment, the inventive crosspoint switch simply direct s input data bits to an output port with no clocking.

Allows for optimized performance, minimum set up and data latencies, throughout a switched system.

The combination of the separate data and control/address lines to each port allows for optimization of doorbelling (getting the attention of other system elements (such as other microprocessors), messaging, read requests, and mutli-cast/broadcast operations (typical operations in various systems, an example would be servers). These unusual communications type command, that are quite different from the normal (high speed) data transmission requests, can be allocated to the least bandwidth consumed channel—the control/address channel. For example, these commands may be programmed via the control/addressing lines and decoded in the switch to perform the action or actions designated.

Another advantage of the present invention is that the packetized data that is routed according to the control and address lines, often will contain embedded protocols that are invisible to the inventive crosspoint switch. So TCP/IP, FTP, Ethernet and any other types of higher internet framing information will be passed along as strictly data. Similarly if control or addressing were required at the end users, as distinguished from the inventive cross switch, such can be sent via the data or control lines and decoded at the end user.

The present invention provides for multiple requests that can be sent simultaneously with data, and with control and addressing sent in parallel with the data, data is effectively "pipelined" for maximum data throughput. "Pipeline" here refers to data being sent continuously, back to back. Moreover multicast and broadcast is directly accomplished, and input/output channels through the inventive crosspoint switch can be hardened or locked to each other to handle, for example, priority transfers, while again reducing latency even further.

Yet another advantage of the present invention is the ability to change the internal crosspoint switch internal connections on-the fly. That is the control and address lines can be changed concurrently with data. In such a case, the synchronization of the data words and the control/addressing can be handled by the sending system to maintain data coherency.

In preferred embodiments there may be at least three ports, but in other preferred embodiments there may be as many ports as the backplane and hardware (pin outs) can accommodate. Hundreds or more ports may be implemented with the present invention.

It will be appreciated by those skilled in the art that although the following illustrative embodiment will proceed with reference being made to illustrative embodiments, the drawings, and methods of use, the present invention is not intended to be limited to these embodiments and methods of use. Rather, the present invention is of broad scope and is intended to be defined as only set forth in the accompanying claims.

BRIEF DESCRIPTION OF THE DRAWINGS

The invention description below refers to the accompanying drawings, of which.

DETAILED DESCRIPTION OF AN ILLUSTRATIVE EMBODIMENT

Figure 1:
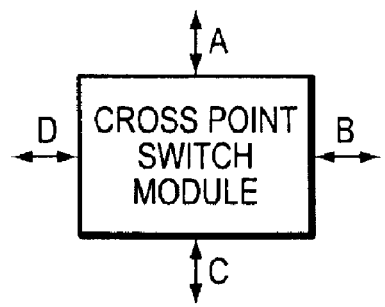
FIG. 1 is a block diagram of a prior art crosspoint switch.
Figure 2:
FIG. 2 is a packet diagram of a prior art format of control and data.
Figure 3:
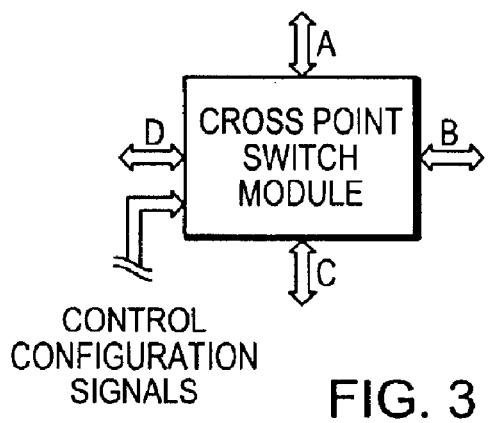
FIG. 3 is block diagram of a prior art four port cross-point switch showing a single input for address and control of all four switches.
Figure 4:
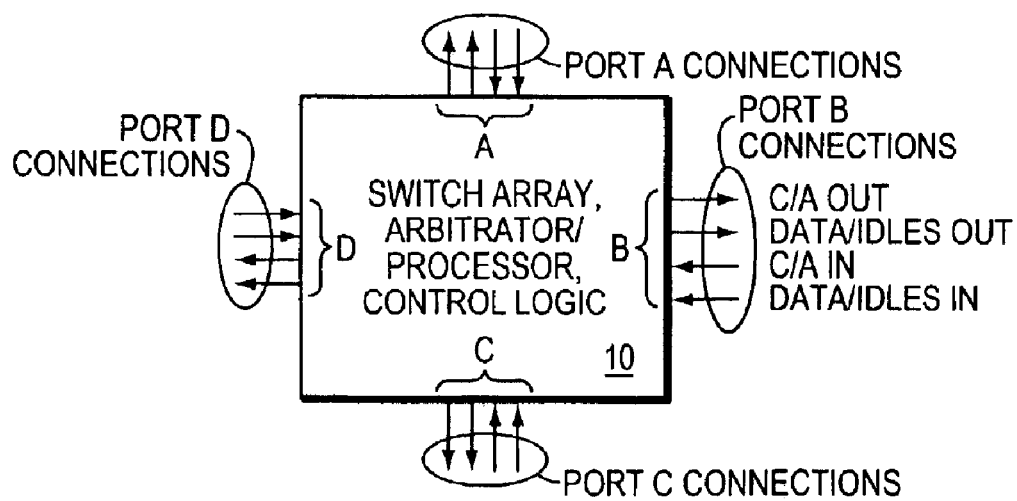
FIG. 4 is a diagram of an embodiment of the present inventive crosspoint switch module.

FIG. 4 shows a cross-point switch module 10 with four input/output ports. For example port B, shows an input signal line handling data and idles and a separate input line handling control and addressing. As shown in FIG. 4, the connections for a single port include C/A and data inputs and output connections. Here IDLES are defined, in one embodiment, when no data is ready to be sent, as filler or timing signals sent just to maintain the clocking within the cross-point switch module. In this embodiment the clocking is derived from the sequential stream of data (including IDLES) so no separate clock line is provided. The crosspoint switch generates the clock from the IDLES' or data edge transitions. In one embodiment, the data, independent of the content, or IDLES always provides edge transitions that will guarantee that proper clocking, as discussed below. Such techniques are well known in the art. For example a phase locked loop can lock onto a clock based on incoming data on a given data line given the data carries a steady stream of actual data or IDLE signals.

In FIG. 4, the control and address (C/A) and the data inputs and outputs are shown as single lines, however, differential pairs or other similar physical wiring may be used to transfer information bit serial. Here the phrase "crosspoint switch module" is distinguished from the term "crosspoint switch," in that the use of "module" includes one or more physical switch arrays that perform the actual in/out connection (a crosspoint switch) plus the arbitrator control logic, a processor, shown and described with respect to FIG. 9.

In another example of the present invention the control and address lines comprise one line where the control and address information is received serially. But other embodiments several parallel lines are used where at least some of the information is transferred in a parallel fashion and some in serial fashion. Protocols to accomplish are well known in the field. Separate clock lines and separate additional control lines may be found in some preferred embodiments, and other self clocking systems may be found where no IDLES may be sent.

Figure 5:
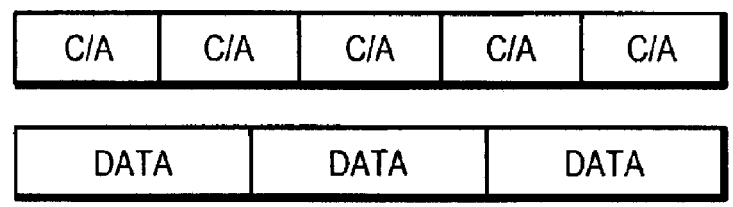
FIG. 5 is an illustration of the format of control and address lines and the separate data lines.
Figure 6:
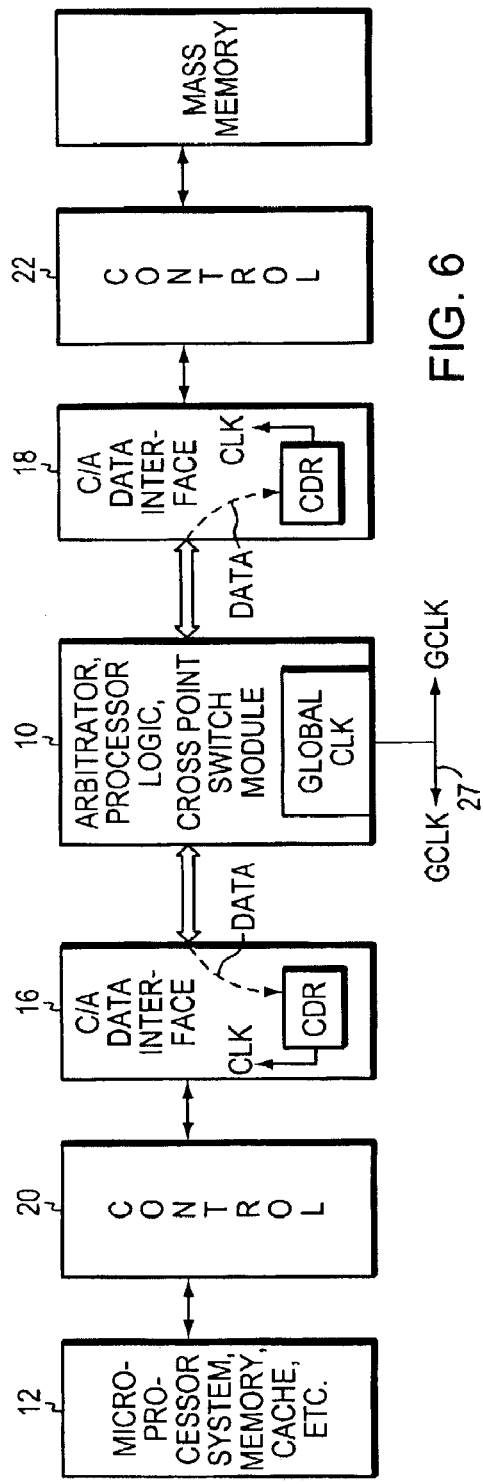
FIG. 6 is a block diagram of a multi-element system incorporating the invention crosspoint switch module.

FIG. 5 shows a representative format diagram of information delivered to and from a crosspoint switch module. FIG. 6 shows an example of a microprocessor system 12 communicating with a mass memory 14 via an embodiment of the present invention. The C/A and data lines are sourced and terminated at the modules or systems 12 and 14 that are sending and receiving the information to and from each other. The C/A lines within the port B and port C cause the crosspoint switch module to arrange a connection between the two systems 12 and 14. The actual data stream may be formatted with respect to specifications and limitations of these end systems without the cross-point switch understanding the formatting, for example, the local mass memory address may be contained in the data word, or the "five or seven layer" formatting that is common in Internet communications will be in the data word. That data, for example, on the data path may have start of frame, end of frame or packet, and error checking depending on the particular end systems, for example, an Ethernet packet that had embedded address and control signals that are sent as "data" to the cross-point switch.

As shown in FIG. 6 each port connects to an interface 16 and 18 that complies to the requirements of the switch module for sending and receiving the C/A and data signals and the required serialization and deserialization, buffering and clocking. There is necessary control logic 20 and 22 that complete the logic connections to the physical systems, in this case a system 12, that includes a microprocessor, and the mass memory 14. A typical information interchange between these two systems might include the microprocessor 12 asking the mass memory for some stored information. The microprocessor would, via the C/A lines of port D direct the arbitrator 19 (which is typically microprocessor based) in the crosspoint switch module to direct the data lines of port D to the output data lines of port B connecting to the mass memory. The data signals on port D and B are received by the mass memory and would direct it to send back to the system 12 information in some addressed block. The read request will be sent over the C/A lines of port B to the mass memory, but the local mass memory 14 address would be, in this case, contained in the data words of port B. Other organizations could be used to advantage in other systems.

FIG. 6 represents interconnections that may be found on a known electronic backplane interconnection assembly. The backplane may connect to a plurality of electronic systems defining input, output, control and address connections carrying information, in serial form and in parallel form available at the backplane. The programmable switch is connected to both the inputs and the outputs of a number of the data, the control, and the address connections and may be configured to interconnect any or all the electronic systems to each other. The backplane may connect computer system including processors, microprocessors memories, including operating, cache and mass storage, displays, control panels, printers, scanners, instrumentation electronics and communications systems.

In this embodiment a global clock 21 is generated on the switch module and fed 23 to the microprocessor system and to the mass memory 14. In one this preferred embodiment the global clock may be sent via the data lines to clock and data recovery (CDR) circuits 25 where a local clock is recovered for use by the local module. In another embodiment, the global clock may be sent to other modules via a separate pin 27. The CDR circuit will usually include a phase locked loop (PLL) for synchronizing the clocks.

Figure 7:
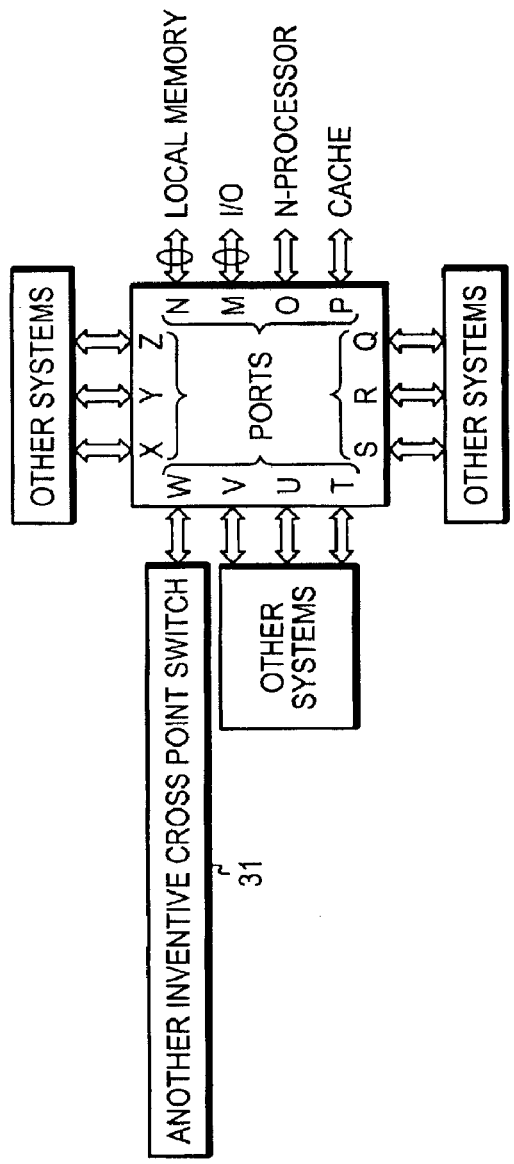
FIG. 7 is a block diagram of an inventive crosspoint switch module interconnecting many other system functions.

FIG. 7 illustrates a multiported crosspoint switch module that inter-connects, point to point, many different systems. The number of such interconnections, say on a backplane of a large system, is limited by the space and pin outs available. Of note is that one of the systems interconnected by the crosspoint switch module is another inventive crosspoint switch module.

Figure 8:
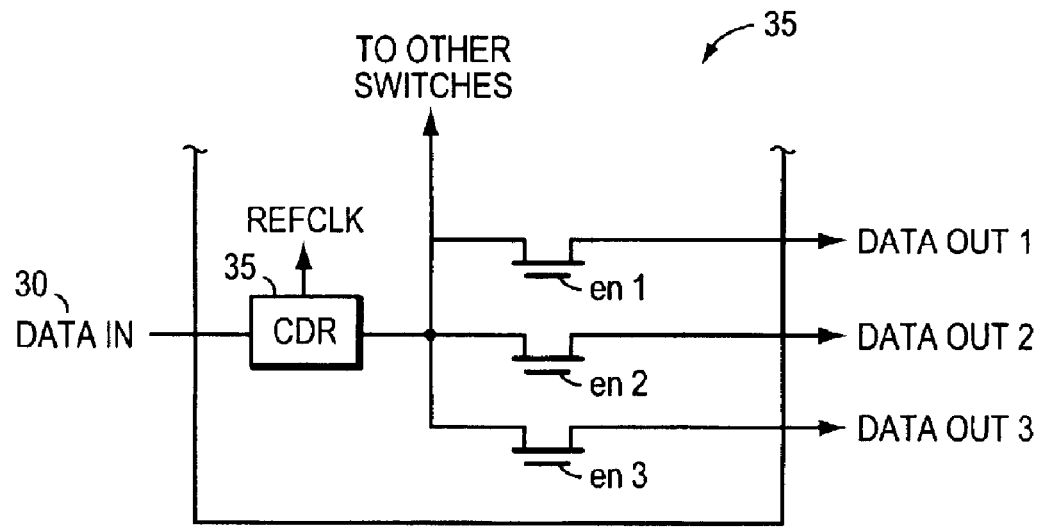
FIG. 8 is a representative schematic of the paht of a singal data signal.

FIG. 8 illustrates, without detail, an advantage of the present invention. Here a data in line 30 is received and, as discussed below, sent via MOSFET's (transistors) 34 directly out when the corresponding enable (EN1, etc.) signals are true. The traversing of the data in signal to the data out signal includes no latches, no fifos and the reclocking delays entailed in their use. Thus, in this embodiment there are no extensive delays due to setup or logic decisions. Of note is that there is CDR 35, clock/data recovery logic, 33 that receives the data in or IDLE signals and recovers a clock signal for use by the crosspoint switch electronics. In this case the source of the data in signals is directed to always send IDLE signals so as to maintain the internal crosspoint switch clock. There can be an "OR" type logic that receives all the input data signals and therefrom generate the clock. Such electronics to accomplish this task are well known in the art.

When clock speed of two or more megaHertz are used the CDR may include, in addition to a PLL, a few stages of latched delay to ensure that the data is properly synchronized. Such designs are well known in the art. In one preferred embodiment, the delay will be from a few clock cycles to twenty or so.

Figure 9:
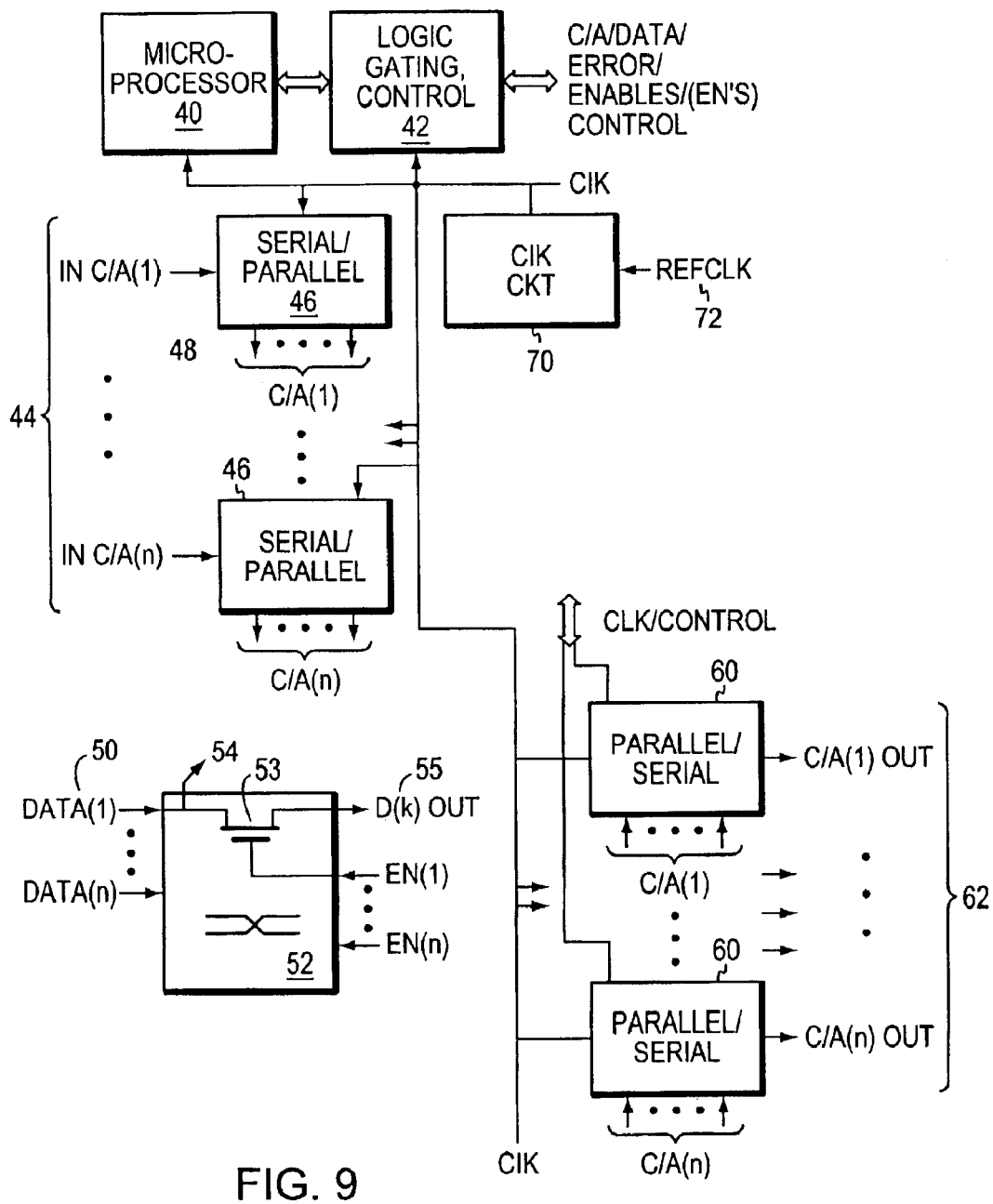
FIG. 9 is a circuit schematic illustrating the logic within one inventive switch module.

FIG. 9 illustrates the internal electronics within a preferred embodiment of a present crosspoint switch module. There is a controlling micro-processor 40 that is programmed to control the switching functions via control logic 42. The control logic 42 connects to all the other blocks in the block diagram as indicated by the following discussion. Also, the needed peripheral type functions, including both hardware and software. Such as, local memory, latches, interrupts, software traps, clocks, power as provided to the microprocessor and to the other electronics illustrated but are not shown. The block diagram includes the C/A and DATA inputs and outputs for "n" ports. The operation for all the "n" ports is identical (but flexible), so it will be discussed for one port only. For port (1), a C/A input signal 44 is connected to a deserializer that converts the serial bit flow to a parallel word 48 that can be read by the microprocessor. That information may direct the microprocessor, for example, to direct the data DATA(1) via the physical crosspoint switch 52 transistor 53 to be output on DATA out port K (D(K)OUT) 55. In accordance with the internal arrangement of the crosspoint switch 52 matrix all DATA IN lines, e.g. D(1), are connected to a matrix of physical switches that allows each DATA IN input to be direct to any one or groupings of the DATA OUT lines of any port.

There are C/A output lines 60, where the microprocessor, in parallel, loads parallel to serial converters 60 for each output port, to send the C/A data out from the crosspoint switch module.

With respect to clocking, there is a clock circuit 70 that receives a REF CLK 72 and generates a CLK therefrom. The CLK drives the deserializers 46 and serializers 60, and other arbitrator and processing logic within the crosspoint siwtch module. In this case DATA(n) is connected to logic 73 designed to recover a clock signal from the data signal and generate the REFCLK 72. In other embodiments, as mentioned before, a global clock may be connected to the crosspoint switch module as the internal REFCLK.

Figure 10:
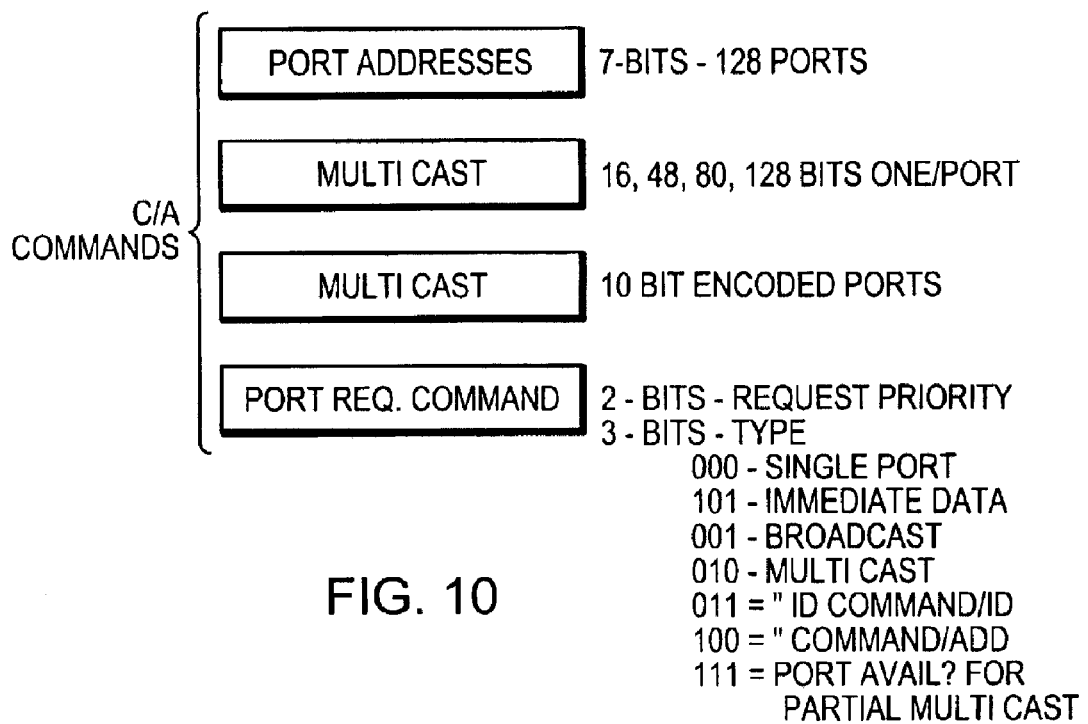
FIG. 10 is an example of the types of information exchanged over the control and address (C/A) lines.

FIG. 10 illustrates an example of encoding on the C/A (control/address) lines that may be used to advantage by the present invention. These are commands that typically are not associated with high speed data transfers, and are efficiently encoded on information sent on the control/address lines of a port. Here a sending port might send a single 7-bit address that encodes one of 128 selectable addresses. Multicast addressing may be sent so that the data message will be sent to all or some specific group of individual address. In different embodiments 16, 48, 80 and 128 bits were used where each bit represented a specific port that was to receive the data. However, the ports may alternatively be encoded in one embodiment in a ten bit word. Port transmission commands in a preferred embodiment may include 8-bits. Here 2-bits are for priority, 3-bits to indicate request type. Other uses may be found fo the remaining bits.

The request types may include within the 3-bits: (000) a single port command followed by an address, (101) an immediate request with data in parallel, (001) a broadcast, (010) multicast list identifier followed by port sequences and the identifier, (011) multicast identifier command followed by a multicast identifier, and (100) a multicast command followed by a sequence of 8-bit addresses.

In another preferred embodiment, a minimum cast request may be sent asking how many ports must be available before the partial multicast can be activated.

In a preferred embodiment, and as alluded to above, information on a data line and the parallel C/A line will be input to the cross-point switch where the internal processor 40 (or processors) of FIG. 9 will interpret the control and address lines, determine where the information should be directed, check for availability of the outgoing port, and send required control and address information back to the requesting port when the outgoing port is available, and then output required control and address and data to the proper outgoing port. The address is typically the destination address for the data, but the selection of the proper output port may be made in any of several well known mechanisms. One mechanism is to have the port number as the destination address as part of the control and address stream so that the connection is directly made and the required address, control and data are all put on the proper output port lines. In most cases, the address sent to the destination port is the address of the sourcing port. This would be direct addressing. Another, more common form of addressing requires that there is some overall look up table or other such means for the sender system to know on which switch port the destination address may be found.

In one preferred embodiment the subsystem sending the data, control, and address to the cross-point switch will have a table lookup, that was preprogrammed with the addresses available at the different ports. The processor accesses the table and outputs the information for the proper port. One arrangement to accomplish this has addresses reserved for the cross-point switch itself or some other control code that accomplishes the same objective. Other logic arrangements are known and may be used in other preferred embodiments depending on the type of system and requirements of the system. For example, functions suitable for the crosspoint switch as applied to a server function would include passing message between microprocessors, getting the attention of another processor, cache coherency functions to manage and maintain changes (for example broadcasting updates), keeping the setup time from a request for data to the arrival at a minimum, and the need to synchronized data among various processors.

In one embodiment, it is arranged that the cross-point switch may contain microprocessors, input/output buffers, control and storage buffers, cache and the like that are well known in the field.

In another preferred embodiment, the switch may be configured to control multiple data channels via a single control/address line.

It should be understood that above-described embodiments are being presented herein as examples and that many variations and alternatives thereof are possible. Accordingly, the present invention should be viewed broadly as being defined only as set forth in the hereinafter appended claims.

What is claimed is:

1. A programmable switch of at least three ports comprising:
   data in signal connections and data out signal connection associated with each port,
   separate control and address signal in connections, and separate control and address signal out connections associated with each port, wherein the programmable switch is configured from the information on the control and address signal in connections, and
   a logic controller for making logical distributions of the data signals and the control and address signals among the ports.

2. The programmable switch of claim 1 further comprising a single switch arranged between a data in connection at one port and one or more data out connections of other ports, wherein the data in signals experience only a single on-transistor switch or gate delay when traversing the switch.

3. The programmable switch of claim 1 further comprising a time delay buffer arranged between a data in connection at one port and one or more data out connections of the other ports, wherein the data in signals experience only a few clock cycles of delay when traversing the switch.

4. The programmable switch of claim 1 wherein the data in, the data out, the control and address in and the control and address out connections are single lines suitable for carrying serial data.

5. The programmable switch of claim 1 wherein the data in, the data out, the control and address in and the control and address out connections are each comprised of one or more parallel lines.

6. The programmable switch of claim 1 wherein the data in, the data out, the control and address in and the control and address out connections are each comprised of one or more differential parallel lines.

7. The programmable switch of claim 1 further comprising:
   a logic controller arbitrator,
   a deserializer that converts a serial control or address signal input stream into parallel signals,
   first electrical connections from the control and addressing connections to the deserializer,
   second electrical connections from the parallel output signals of the deserializer to the logic controller,
   under the control of the logic controller, means for enabling the data in signal to be output on selected data out connections of other ports.

8. The programmable switch of claim 7 wherein the logic controller decodes the parallel input signals as commands, wherein the commands include door bells, broadcast, selective broadcast, read requests, port selection and priority commands.

9. The programmable switch of claim 1 further comprising a backplane interconnection assembly including a plurality of electronic systems defining input, output, control and address connections carrying information, in serial form and in parallel form, wherein this information is available at the backplane, and wherein the programmable switch is connected to both the inputs and the outputs of a number of the data and the control and address connections.

10. A method for interconnecting electronic systems to each other comprising the steps of:
    defining ports for accepting data in signal connections and data out signals connection associated with each electronic system, transmitting the data signals from one port to another separating control and address signal in connections, and separating control and address signal out connections associated with each port, configuring and making logical distributions of the data signals and the control and address signals among the ports.

11. The method of claim 10 further comprising the step of arranging a single buffer switch between a data in connection at one port and one or more data out connections of the other ports, wherein the data in signals experiences substantially only a single on-transistor switch or gate delay when traversing the switch.

12. The method of claim 10 further comprising the step of arranging a delay buffer between a data in connection at one port and one or more data out connections of the other ports, wherein the data in signals experience only a few clock cycles of delay when traversing the switch.

13. The method of claim 10 further comprising the step of configuring the data in, the data out, the control and address in and the control and address out connections as single lines.

14. The method of claim 10 further comprising the step of configuring the data in, the data out, the control and address in and the control and address out connections as each comprised of one or more parallel lines.

15. The method of claim 10 further comprising the step of configuring the data in, the data out, the control and address in and the control and address out connections as each comprised of one or more differential parallel lines.

16. The method of claim 10 further comprising the steps of:

defining a logic controller arbitrator, deserializing a serial control or address signal input stream into parallel signals, first electrical connecting the control and addressing connections to the deserializer, second electrical connecting the parallel output signals of the deserializer to the logic controller, under the control of the logic controller, enabling the data in signal to be output on selected data out connections of other ports.

17. The method of claim 16 further comprising the steps of decoding the parallel input signals as commands, wherein the commands include door bells, broadcast, selective broadcast, read requests, port selection and priority commands.

18. The method of claim 10 further comprising the step of defining a backplane interconnection assembly including a plurality of electronic systems defining input, output, control and address connections carrying information, in serial form and in parallel form, wherein this information is available at the backplane, and wherein the programmable switch is connected to both the inputs and the outs of a number of the data and the control and address connections.

* * * * *